United States Patent
Kimata et al.

(10) Patent No.: US 9,453,868 B2
(45) Date of Patent: Sep. 27, 2016

(54) TEST DEVICE, TEST METHOD, AND PROGRAM

(75) Inventors: Hiroyuki Kimata, Tokyo (JP); Satoru Ishizaka, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 170 days.

(21) Appl. No.: 14/372,101

(22) PCT Filed: Mar. 23, 2012

(86) PCT No.: PCT/JP2012/057636
§ 371 (c)(1),
(2), (4) Date: Jul. 14, 2014

(87) PCT Pub. No.: WO2013/140630
PCT Pub. Date: Sep. 26, 2013

(65) Prior Publication Data
US 2015/0241495 A1  Aug. 27, 2015

(51) Int. Cl.
*G01R 31/02* (2006.01)
*G01R 31/00* (2006.01)
*G01R 31/28* (2006.01)

(52) U.S. Cl.
CPC ......... *G01R 31/002* (2013.01); *G01R 31/2817* (2013.01)

(58) Field of Classification Search
CPC .............. G01R 31/02; G01R 31/2817; G01R 31/3161; G01R 31/31824
USPC ........................................ 324/613, 600, 612
See application file for complete search history.

(56) References Cited

U.S. PATENT DOCUMENTS

| 5,668,477 | A | * | 9/1997 | Mahmoudian | G11B 5/3163 324/210 |
| 6,429,676 | B1 | * | 8/2002 | Chun | G01R 31/3161 324/762.02 |
| 2005/0254192 | A1 | | 11/2005 | Choo | |
| 2005/0258842 | A1 | | 11/2005 | Maloney | |

FOREIGN PATENT DOCUMENTS

| DE | 42 24 858 A1 | 2/1994 |
| JP | 3-252564 A | 11/1991 |
| JP | 4-115634 A | 4/1992 |
| JP | 5-209917 A | 8/1993 |
| JP | 6-332748 A | 12/1994 |
| JP | 2008-177796 A | 7/2008 |
| WO | 99/30172 A2 | 6/1999 |

OTHER PUBLICATIONS

Extended European Search Report dated Nov. 20, 2015, issued by the European Patent Office in corresponding European Patent Application No. 12872025.7-1560. (14 pages).
International Search Report (PCT/ISA/210) mailed on Apr. 24, 2012, by the Japanese Patent Office as the International Searching Authority for International Application No. PCT/JP2012/057636.
Written Opinion (PCT/ISA/237) mailed on Apr. 24, 2012, by the Japanese Patent Office as the International Searching Authority for International Application No. PCT/JP2012/057636.

* cited by examiner

*Primary Examiner* — Vincent Q Nguyen
(74) *Attorney, Agent, or Firm* — Buchanan Ingersoll & Rooney PC

(57) ABSTRACT

When static electrical charge by electromagnetic waves is applied to a test-target board or test noises are applied to the ground of the test-target board, a test device tests as to whether or not noises are conducted through a path from an OUT terminal of an amplifier circuit to the ground of the test-target board, and a test device tests as to whether or not noises are conducted through a path from an OUT terminal of an amplifier circuit to the ground of the test-target board together with the number of conductions.

8 Claims, 5 Drawing Sheets

TEST DEVICE, TEST METHOD, AND PROGRAM

TECHNICAL FIELD

The present disclosure relates to a test device, a test method, and a program.

BACKGROUND ART

Patent Literature 1 discloses a power-source noise detector circuit which applies noises to a circuit formed on a board, and which inspects whether or not such noises are conducted through a path over that circuit.

The power-source noise detector circuit disclosed in Patent Literature 1 includes a flip-flop, and when no noise is conducted through a power-source path, maintains the polarity of the output by the flip-flop. Conversely, when noises are conducted through the power-source path, the polarity of the output by the flip-flop is inverted. Next, when the polarity of the output by the flip-flop is inverted, the power-source noise detector circuit causes a light emitting diode to emit light. Through this light emission, the power-source noise detector circuit informs that noises are conducted through the power-source path.

CITATION LIST

Patent Literature

Patent Literature 1: Unexamined Japanese Patent Application Kokai Publication No. H04-115634

SUMMARY OF INVENTION

Technical Problem

According to the aforementioned power-source noise detector circuit, when noises are conducted through the path over the circuit even once, the light emission by the light emitting diode is maintained. Hence, this power-source noise detector circuit is unable to, for example, apply noises to the circuit several times, and to let a user to know which path noises are conducted and how much such noises are conducted. That is, this power-source noise detector circuit has a disadvantage that it is difficult for the user to know a path through which noises are likely to be conducted or a path through which noises are not likely to be conducted.

The present disclosure has been made in view of the foregoing circumstances, and it is an objective of the present disclosure to provide a test device, a test method, and a program which allows a user to know a path through which noises are likely to be conducted and a path through which noises are not likely to be conducted.

Solution to Problem

To accomplish the above objective, a detector of a test device according to the present disclosure detects a conduction of noises applied to a circuit multiple times through a path over the circuit. A counter counts a number of conductions of the noises through the path detected the detector. A display displays the number of conductions of the noises counted by the counter.

Advantageous Effects of Invention

According to the present disclosure, it becomes possible for a user to know a path through which noises are likely to be conducted and a path through which noises are not likely to be conducted.

DESCRIPTION OF EMBODIMENTS

First Embodiment

An explanation will be below given of a noise test system 1 according to a first embodiment of the present disclosure with reference to FIGS. 1 to 3.

Figure 1:
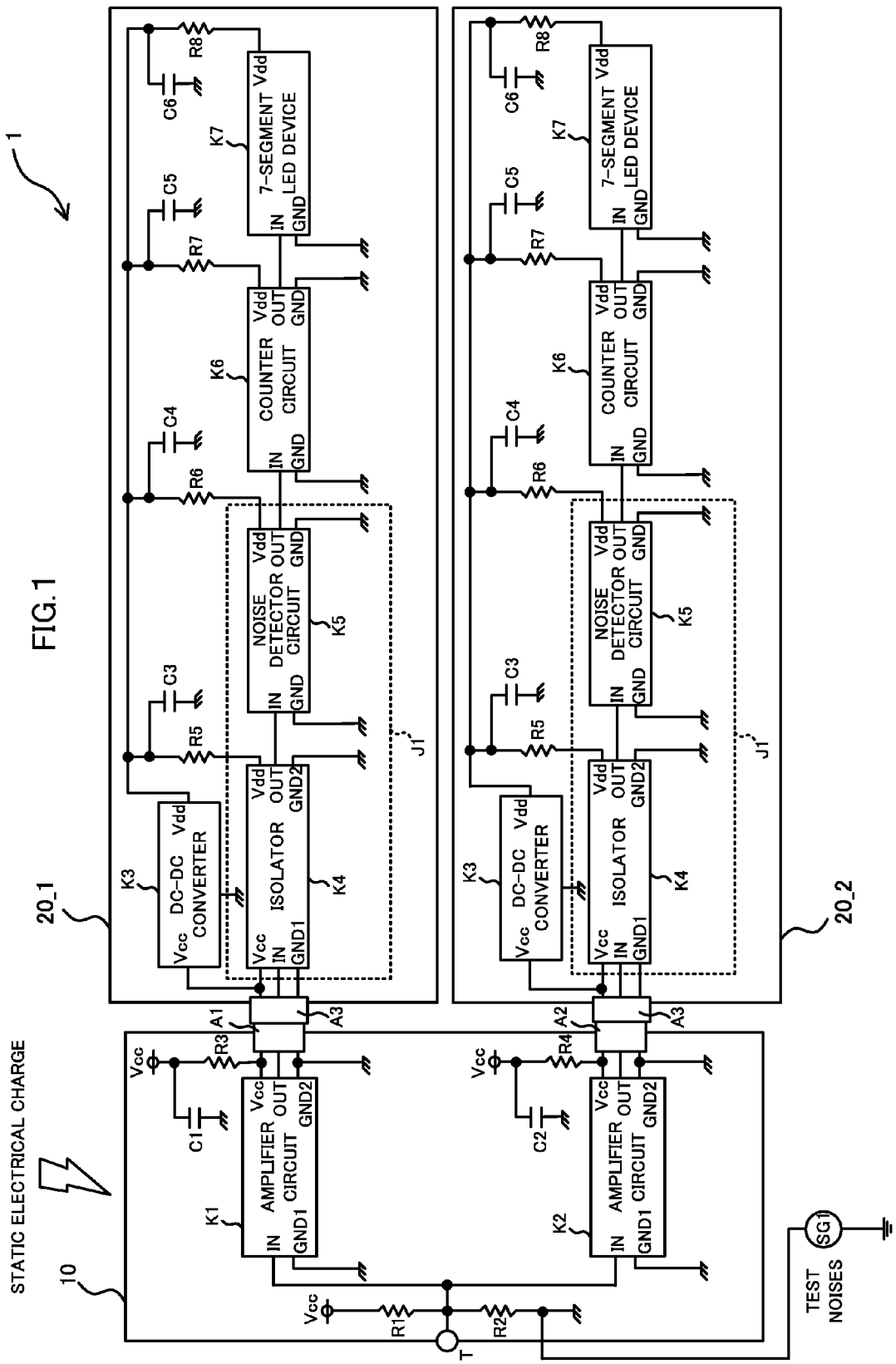
FIG. 1 is a block diagram of a noise test system according to a first embodiment of the present disclosure.

The noise test system 1 includes, as is illustrated in the block diagram of FIG. 1, a test-target board 10, a test device 20_1, and a test device 20_2.

The test-target board 10 includes an electronic device, and a circuit formed of wirings connected to the electronic device. The test-target board 10 is a board subjected to a test as to whether or not noises applied to the circuit from an external device are conducted through a path over the circuit. The test-target board 10 includes amplifier circuits K1, K2, resistors R1 to R4, capacitors C1, C2, a DC power source Vcc, and connectors A1, A2.

The amplifier circuit K1 and the amplifier circuit K2 amplify voltage applied to the resistor R2, that is, signals input to respective IN terminals, and output amplified signals through respective OUT terminals. The resistor R2 has one end connected to an input terminal T, one end of the resistor R1, and respective IN terminals of the amplifier circuits K1, K2, and has the other end connected to the ground of the test-target board 10. The resistor R1 has the other end connected to the DC power source Vcc.

In addition, Respective GND1 terminals of the amplifier circuits K1, K2 and respective GND2 terminals thereof are connected the ground of the test-target board 10 and respective GND1 terminals of isolators K4. When, for example, the test-target board 10 is applied to a product like a cellular phone, AC signals like sound signals are input to the input terminal T through a capacitor.

In this case, the amplifier circuit K1 and the amplifier circuit K2 have a common function of amplifying input signals to the respective IN terminals, but have different internal circuit configurations. Hence, the amplifier circuit K1 and the amplifier circuit K2 have different gains for the signals.

The amplifier circuit K1 has the OUT terminal connected to an IN terminal of the isolator K4 of the test device 20_1 through the connector A1. The amplifier circuit K2 has the OUT terminal connected to an IN terminal of the isolator K4 of the test device 20_2 through the connector A2.

In addition, the amplifier circuit K1 has a Vcc terminal connected to the DC power source Vcc through the resistor R3. Still further, the amplifier circuit K1 has the Vcc terminal connected to a Vcc terminal of the isolator K4 of the test device 20_1 and a Vcc terminal of a DC-DC converter K3 thereof through the connector A1.

The amplifier circuit K2 has a Vcc terminal connected to the DC power source Vcc through the resistor R4. In addition, the amplifier circuit K2 has the Vcc terminal connected to a Vcc terminal of the isolator K4 of the test device 20_2 and a Vcc terminal of a DC-DC converter K3 thereof through the connector A2.

The amplifier circuit K1 and the amplifier circuit K2 utilize DC power supplied from the DC power source Vcc, and amplify the signals input to the respective IN terminals.

The DC power source Vcc supplies, for example, DC voltage of 3.3 volts.

One end of the resistor R3 and one end of the capacitor C1 are connected to the DC power source Vcc. The other end of the resistor R3 is connected to the Vcc terminal of the amplifier circuit K1, the Vcc terminal of the isolator K4 of the test device 20_1, and the Vcc terminal of the DC-DC converter K3. In addition, the other end of the capacitor C1 is connected to the ground of the test-target board 10.

One end of the resistor R4 and one end of the capacitor C2 are connected to the DC power source Vcc. The other end of the resistor R4 is connected to the Vcc terminal of the amplifier circuit K2, the Vcc terminal of the isolator K4 of the test device 20_2, and the Vcc terminal of the DC-DC converter K3. In addition, the other end of the capacitor C2 is connected to the ground of the test-target board 10.

A high-pass filter is formed of a circuit configured by the resistor R3 and the capacitor C1, and a circuit configured by the resistor R4 and the capacitor C2. This high-pass filter eliminates noises superimposed on DC voltage output by the DC power source Vcc.

Static electrical charge by electromagnetic waves is applied to the circuit formed on the above-explained test-target board 10. Alternatively, test noises are applied to the ground (a terminal of the resistor R2 at the ground side disposed on the test-target board 10) of the circuit formed on the test-target board 10 from a signal source SG1. Next, the test device 20_1 and the test device 20_2 test as to whether or not noises are superimposed on signals output by the amplifier circuit K1 and the amplifier circuit K2 through the respective OUT terminals. In other words, the test device 20_1 and the test device 20_2 test as to whether or not noises are conducted through paths from the respective OUT terminals of the amplifier circuit K1 and the amplifier circuit K2 to the ground of the test-target board 10.

One end of the signal source SG1 outputting test noises is connected to the ground of the test-target board 10, and the other end of the signal source SG1 is grounded to the earth. In addition, in the following explanation, the static electrical charge applied to the circuit and the test noises applied to the circuit will be simply referred to as noises.

The test device 20_1 is electrically connected to the test-target board 10 through a connector A3 and the connector A1. The test device 20_1 tests, as explained above, as to whether or not noises are conducted through a path from the OUT terminal of the amplifier circuit K1 to the ground of the test-target board 10.

In addition, the test device 20_2 is electrically connected to the test-target board 10 through a connector A3 and the connector A2. The test device 20_2 tests, as explained above, as to whether or not noises are conducted through a path from the OUT terminal of the amplifier circuit K2 to the ground of the test-target board 10.

The test device 20_1 and the test device 20_2 have the same configuration and the same function.

The test device 20_1 and the test device 20_2 each include the DC-DC converter K3, a tester J1 (isolator K4 and noise detector circuit K5), a counter circuit K6, a 7-segment LED device K7, resistors R5 to R8, capacitors C3 to C6, and the connector A3.

The DC-DC converter K3 boosts the DC voltage supplied from the DC power source Vcc, that is, the DC voltage applied to the Vcc terminal to, for example, DC voltage of 5 volts, and outputs the boosted voltage through a Vdd terminal.

The DC-DC converter K3 of the test device 20_1 has the Vcc terminal connected to the Vcc terminal of the isolator K4, the Vcc terminal of the amplifier circuit K1, and the other end of the resistor R3, and has the Vdd terminal connected to respective one ends of the resistors R5 to R8 and respective one ends of the capacitors C3 to C6.

In addition, the DC-DC converter K3 of the test device 20_2 has the Vcc terminal connected to the Vcc terminal of the isolator K4, the Vcc terminal of the amplifier circuit K2, and the other end of the resistor R4, and has the Vdd terminal connected to the respective one ends of the resistors R5 to R8 and the respective one ends of the capacitors C3 to C6.

The tester J1 tests as to whether or not noises (static electrical charge and test noises) applied to the circuit formed on the test-target board 10 are conducted through a path on the circuit. More specifically, the tester J1 of the test device 20_1 tests as to whether or not noises applied to the circuit are conducted through a path from the OUT terminal of the amplifier circuit K1 to the ground of the test-target board 10. In addition, the tester J1 of the test device 20_2 tests as to whether or not noises applied to the circuit are conducted through a path from the OUT terminal of the amplifier circuit K2 to the ground of the test-target board 10.

The tester J1 includes the isolator K4, and the noise detector circuit K5.

The isolator K4 transmits the signal input to the IN terminal to the OUT terminal by electromagnetic induction with the current input to the IN terminal being cut off.

Accordingly, the isolator K4 of the test device 20_1 transmits noises conducted through the path from the OUT terminal of the amplifier circuit K1 to the ground of the test-target board 10 to the OUT terminal by electromagnetic induction.

In addition, the isolator K4 of the test device 20_2 transmits noises conducted through the path from the OUT terminal of the amplifier circuit K2 to the ground of the test-target board 10 to the OUT terminal by electromagnetic induction.

The Vcc terminal of the isolator K4 of the test device 20_1 is connected to the Vcc terminal of the DC-DC converter K3 of the test device 20_1, the Vcc terminal of the amplifier circuit K1 and the other end of the resistor R3.

Still further, the IN terminal of the isolator K4 of the test device 20_1 is connected to the OUT terminal of the amplifier circuit K1.

The GND1 terminal of the isolator K4 of the test device 20_1 is connected to the GND2 terminal of the amplifier circuit K1 and the ground of the test-target board 10.

In addition, the GND2 terminal of the isolator K4 of the test device 20_1 is connected to the ground of the test device 20_1. The OUT terminal of the isolator K4 of the test device 20_1 is connected to an IN terminal of the noise detector circuit K5 of the test device 20_1. Still further, the Vdd terminal of the isolator K4 of the test device 20_1 is connected to the other end of the resistor R5 of the test device 20_1. That is, the Vdd terminal of the isolator K4 of the test device 20_1 is connected to the Vdd terminal of the DC-DC converter K3 of the test device 20_1 through the resistor R5. The capacitor C3 of the test device 20_1 connected to the Vdd terminal of the DC-DC converter K3 has the other end connected to the ground of the test device 20_1.

In addition, the Vcc terminal of the isolator K4 of the test device 20_2 is connected to the Vcc terminal of the DC-DC converter K3 of the test device 20_2, the Vcc terminal of the amplifier circuit K2 and the other end of the resistor R4.

The IN terminal of the isolator K4 of the test device 20_2 is connected to the OUT terminal of the amplifier circuit K2.

The GND1 terminal of the isolator K4 of the test device 20_2 is connected to the GND2 terminal of the amplifier circuit K2 and the ground of the test-target board 10.

In addition, the GND2 terminal of the isolator K4 of the test device 20_2 is connected to the ground of the test device 20_2. The OUT terminal of the isolator K4 of the test device 20_2 is connected to an IN terminal of the noise detector circuit K5 of the test device 20_2. Still further, the Vdd terminal of the isolator K4 of the test device 20_2 is connected to the other end of the resistor R5 of the test device 20_2. That is, the Vdd terminal of the isolator K4 of the test device 20_2 is connected to the Vdd terminal of the DC-DC converter K3 of the test device 20_2 through the resistor R5. The capacitor C3 of the test device 20_2 connected to the Vdd terminal of the DC-DC converter K3 has the other end connected to the ground of the test device 20_1.

The detail of the isolator K4 will be explained with reference to the block diagram of FIG. 2.

The isolator K4 includes a driver circuit K8, a primary coil L1, a secondary coil L2, and a receiver circuit K9.

The driver circuit K8 detects a rising of a signal S1 input to the IN terminal and a falling thereof, and outputs, for example, two pulses when detecting a rising, and outputs, for example, one pulse when detecting a falling from the OUT terminal to the primary coil L1. The driver circuit K8 performs the above-explained operation with DC voltage supplied from the Vcc terminal of the DC-DC converter K3.

A Vcc terminal of the driver circuit K8 is the Vcc terminal of the isolator K4. An IN terminal of the driver circuit K8 is the IN terminal of the isolator K4. In addition, a GND1 terminal of the driver circuit K8 is the GND1 terminal of the isolator K4.

The driver circuit K8 has an OUT terminal connected to one terminal of the primary coil L1. The driver circuit K8 has a GND terminal connected to the other terminal of the primary coil L1 and the GND1 terminal of the driver circuit K8. That is, the GND terminal of the driver circuit K8, the GND1 terminal thereof, and the other terminal of the primary coil L1 are connected to the ground of the test-target board 10.

The primary coil L1 is a micro coil manufactured through a semiconductor manufacturing process. The individual terminals of the primary coil L2 are connected as explained above.

The secondary coil L2 is also a micro coil manufactured through a semiconductor manufacturing process. The secondary coil L2 and the primary coil L1 are disposed at positions opposite to each other in an insulated condition. More specifically, the primary coil L1 and the secondary coil L2 are disposed so as to face with each other with a predetermined clearance d therebetween, and polyimide is disposed in such a clearance. Hence, with a current being cut off, the isolator K4 is capable of transmitting pulses output by the driver circuit K from the primary coil L1 to the secondary coil L2 by electromagnetic induction. Accordingly, it is possible to prevent a large current generated in association with an application of static electrical charge or test noises to the circuit from flowing into the receiver circuit K9 and further into the noise detector circuit K5 connected at the follower stage of the isolator K4.

The secondary coil L2 has one terminal connected to an IN terminal of the receiver circuit K9, and has the other terminal connected to GND of the receiver circuit K9.

When pulses received by the secondary coil L2 are input into the IN terminal, the receiver circuit K9 reproduces a rising or a falling of a signal in accordance with the number of input pulses, and generates a signal S1'. Next, the receiver circuit K9 outputs the generated signal S1' from the OUT terminal. In this manner, the receiver circuit K9 reproduces the signal S1 input into the IN terminal of the driver circuit K8.

The receiver circuit K9 has the IN terminal connected to the one terminal of the secondary coil L2, and has the GND terminal connected to the other terminal of the secondary coil L2.

In addition, a Vdd terminal of the receiver circuit K9 is the Vdd terminal of the isolator K4. Hence, the receiver circuit K9 performs the above-explained operation with DC voltage supplied from the Vdd terminal of the DC-DC converter K3.

The OUT terminal of the receiver circuit K9 is the OUT terminal of the isolator K4. A GND2 terminal of the receiver circuit K9 is the GND2 terminal of the isolator K4.

Still further, the GND2 terminal of the receiver circuit K9 is connected to the GND terminal of the receiver circuit K9. Hence, the GND terminal of the receiver circuit K9, the GND2 terminal thereof, and the other terminal of the secondary coil L2 are connected to the ground of the test device 20_1 in the case of the isolator K4 of the test device 20_1 and are connected to the ground of the test device 20_2 in the case of the isolator K4 of the test device 20_2.

As explained above, the GND terminal of the receiver circuit K9, the GND2 terminal thereof, and the other terminal of the secondary coil L2 are connected to the ground of the test device 20 (test device 20_1 or test device 20_2). Conversely, the GND terminal of the driver circuit K8, the GND1 terminal thereof, and the other terminal of the primary coil L1 are connected to the ground of the test-target board 10. Accordingly, the ground of the driver circuit K8 and the ground of the primary coil L1, and, the ground of the receiver circuit K9 and the ground of the secondary coil L2 are electrically isolated (a ground loop is cut off). Hence, when no noise (static electrical charge or test noises) is applied, it is possible to prevent unnecessary static electrical charge and the like from being transmitted from the primary coil L1 to the secondary coil L2.

The noise detector circuit K5 illustrated in FIG. 1 includes, in the interior thereof, a low-pass filter, and a comparator disposed at the follower stage of the low-pass filter. When the signal output through the OUT terminal of the isolator K4 is input into the IN terminal, the noise detector circuit K5 performs filtering on the input signal using the low-pass filter. Next, the noise detector circuit K5 causes the comparator to compare the maximum value of the amplitude of the filtered signal (maximum value of voltage) with a preset voltage value. More specifically, the noise detector circuit K5 causes the comparator to compare the maximum value of the amplitude of the filtered signal with a voltage value that causes a false operation of the amplifier circuits K1, K2. Next, when the maximum value of the amplitude of the filtered signal is equal to or greater than the preset voltage value (when noises causing a false operation of the amplifier circuits K1, K2 are superimposed), the noise detector circuit K5 causes the comparator to output a voltage of, for example, 3 volts (positive voltage), thereby outputting the positive voltage through the OUT terminal. Conversely, when the maximum value of the voltage of the filtered signal is smaller than the preset voltage value (when no noise causing a false operation of the amplifier circuits K1, K2 is superimposed), the noise detector circuit K5 causes the comparator to output a voltage of, for example, zero volt (zero voltage), thereby outputting the zero voltage through the OUT terminal.

In this manner, the noise detector circuit K5 detects whether or not noises are superimposed on the signal output by the isolator K4, that is, the signal output by the amplifier circuit K1 or the amplifier circuit K2 of the test-target board 10, and outputs the positive voltage or the zero voltage as a detection result.

Accordingly, the noise detector circuit K5 of the test device 20_1 can test as to whether or not noises superimposed on the circuit are conducted through the path from the OUT terminal of the amplifier circuit K1 to the ground of the test-target board 10. In addition, the noise detector circuit K5 of the test device 20_2 can test as to whether or not noises superimposed on the circuit are conducted through the path from the OUT terminal of the amplifier circuit K2 to the ground of the test-target board 10.

The IN terminal of the noise detector circuit K5 of the test device 20_1 is connected to the OUT terminal of the isolator K4 of the test device 20_1, while the IN terminal of the noise detector circuit K5 of the test device 20_2 is connected to the OUT terminal of the isolator K4 of the test device 20_2.

The GND terminal of the noise detector circuit K5 of the test device 20_1 is connected to the ground of the test device 20_1, while the GND terminal of the noise detector circuit K5 of the test device 20_2 is connected to the ground of the test device 20_2.

The OUT terminal of the noise detector circuit K5 of the test device 20_1 is connected to the IN terminal of the counter circuit K6 of the test device 20_1, while the OUT terminal of the noise detector circuit K5 of the test device 20_2 is connected to the IN terminal of the counter circuit K6 of the test device 20_2.

The Vdd terminal of the noise detector circuit K5 of the test device 20_1 is connected to the other end of the resistor R6 of the test device 20_1, and one end of the resistor R6 is connected to the Vdd terminal of the DC-DC converter K3, and the ground of the test device 20_1 through the capacitor C4. In addition, the Vdd terminal of the noise detector circuit K5 of the test device 20_2 is connected to the other end of the resistor R6 of the test device 20_2, and one end of the resistor R6 is connected to the Vdd terminal of the DC-DC converter K3, and the ground of the test device 20_2 through the capacitor C4. Each noise detector circuit K5 performs the above-explained operation with DC voltage supplied from the Vdd terminal of the DC-DC converter K3.

The other end of the capacitor C4 of the test device 20_1 is connected to the ground of the test device 20_1, while the other end of the capacitor C4 of the test device 20_2 is connected to the ground of the test device 20_2.

The counter circuit K6 includes multiple T-type flip-flops. When the positive voltage output through the OUT terminal of the noise detector circuit K5 is input into the IN terminal, the counter circuit K6 causes the T-type flip-flops to detect a rising of the positive voltage, thereby counting the number of outputs of the positive voltage.

Accordingly, the counter circuit K6 of the test device 20_1 counts the number of conductions of noises applied to the circuit through the path from the OUT terminal of the amplifier circuit K1 to the ground of the test-target board 10. In addition, the counter circuit K6 of the test device 20_2 counts the number of conductions of noises applied to the circuit through the path from the OUT terminal of the amplifier circuit K1 to the ground of the test-target board 10.

An IN terminal of the counter circuit K6 of the test device 20_1 is connected to the OUT terminal of the noise detector circuit K5 of the test device 20_1. An IN terminal of the counter circuit K6 of the test device 20_2 is connected to the OUT terminal of the noise detector circuit K5 of the test device 20_2.

A GND terminal of the counter circuit K6 of the test device 20_1 is connected to the ground of the test device 20_1, while a GND terminal of the counter circuit K6 of the test device 20_2 is connected to the ground of the test device 20_2.

An OUT terminal of the counter circuit K6 of the test device 20_1 is connected to an IN terminal of the 7-segment LED device K7 of the test device 20_1, while an OUT terminal of the counter circuit K6 of the test device 20_2 is connected to an IN terminal of the 7-segment LED device K7 of the test device 20_2. Each counter circuit K6 outputs a control signal in accordance with the number of counting from the OUT terminal to control the display by the 7-segment LED device K7.

A Vdd terminal of the counter circuit K6 of the test device 20_1 is connected to the other end of the resistor R7 of the test device 20_1, and one end of the resistor R7 is connected to the Vdd terminal of the DC-DC converter K3, and the ground of the test device 20_1 through the capacitor C5. In addition, a Vdd terminal of the counter circuit K6 of the test device 20_2 is connected to the other end of the resistor R7 of the test device 20_2, and one end of the resistor R7 is connected to the Vdd terminal of the DC-DC converter K3, and the ground of the test device 20_2 through the capacitor C5. Each counter circuit K6 performs the above-explained operation with DC voltage supplied from the Vdd terminal of the DC-DC converter K3.

The other end of the capacitor C5 of the test device 20_1 is connected to the ground of the test device 20_1, while the other end of the capacitor C5 of the test device 20_2 is connected to the ground of the test device 20_2.

The 7-segment LED device K7 includes seven LEDs (Light Emitting Diodes). The 7-segment LED device K7 performs a display in accordance with the control signal output through the OUT terminal of the counter circuit K6.

More specifically, the 7-segment LED device K7 of the test device 20_1 displays the number of conductions of noises applied to the circuit through the path from the OUT terminal of the amplifier circuit K1 to the ground of the test-target board 10. The 7-segment LED device K7 of the test device 20_2 displays the number of conductions of noises applied to the circuit through the path from the OUT terminal of the amplifier circuit K2 to the ground of the test-target board 10.

The IN terminal of the 7-segment LED device K7 of the test device 20_1 is connected to the OUT terminal of the counting circuit K6 of the test device 20_1. The IN terminal of the 7-segment LED device K7 of the test device 20_2 is connected to the OUT terminal of the counting circuit K6 of the test device 20_2.

A GND terminal of the 7-segment LED device K7 of the test device 20_1 is connected to the ground of the test device 20_1, while a GND terminal of the 7-segment LED device K7 of the test device 20_2 is connected to the ground of the test device 20_2.

A Vdd terminal of the 7-segment LED device K7 of the test device 20_1 is connected to the other terminal of the resistor R8 of the test device 20_1, and one end of the resistor R8 is connected to the Vdd terminal of the DC-DC converter K3, and the ground of the test device 20_1 through the capacitor C6. In addition, a Vdd terminal of the 7-segment LED device K7 of the test device 20_2 is connected to the other terminal of the resistor R8 of the test device 20_2, and one end of the resistor R8 is connected to the Vdd terminal of the DC-DC converter K3, and the ground of the test device 20_2 through the capacitor C6.

The other end of the capacitor C6 of the test device 20_1 is connected to the ground of the test device 20_1, while the other end of the capacitor C6 of the test device 20_2 is connected to the ground of the test device 20_2.

A high-pass filter is formed of a circuit configured by the resistor R5 and the capacitor C3, a circuit configured by the resistor R6 and the capacitor C4, a circuit configured by the resistor R7 and the capacitor C5, and a circuit configured by the resistor R8 and the capacitor C6. This high-pass filter eliminates noises superimposed on DC voltage output through the Vdd terminal of the DC-DC converter K3.

An explanation will now be given of, using the above-explained test device 20_1, an operation of counting the number of conductions of noises applied to the circuit through the path from the OUT terminal of the amplifier circuit K1 to the ground of the test-target board 10, and, using the above-explained test device 20_2, an operation of counting the number of conductions of noises applied to the circuit through the path from the OUT terminal of the amplifier circuit K2 to the ground of the test-target board 10 with reference to the time chart of FIG. 3.

In this time chart, an operation in the following case is illustrated. That is, static electrical charge in accordance with an international standard IEC61000-4-2 is applied to the circuit formed on the test-target board 10 as electromagnetic waves at a time t1. Next, test noises in accordance with a domestic standard JEM-TR177 are applied from the signal source SG1 to the ground terminal of the resistor R2 disposed on the test-target board 10 (to the ground of the circuit formed on the test-target board 10) at a time t2. Subsequently, test noises in accordance with an international standard IEC61000-4-4 are applied from the signal source SG1 to the ground terminal of the resistor R2 disposed on the test-target board 10 (to the ground of the circuit formed on the test-target board 10) at a time t3. FIG. 3 illustrates an operation in such a case.

In this case, the static electrical charge in accordance with the international standard IEC61000-4-2 applied at the time t1 is a simulated static electrical charge generated through a human body and the like. In addition, the test noises in accordance with the international standard IEC61000-4-4 applied at the time t3 are simulated noises produced from industrial apparatuses, produced when, for example, a relay is opened/closed, and produced from a servo. Still further, the test noises in accordance with the domestic standard JEM-TR177 applied at the time t2 are similar noises to the test noises in accordance with the international standard IEC61000-4-4 but have a keener rising than the waveform of the test noises in accordance with the international standard IEC61000-4-4.

Figure 3:
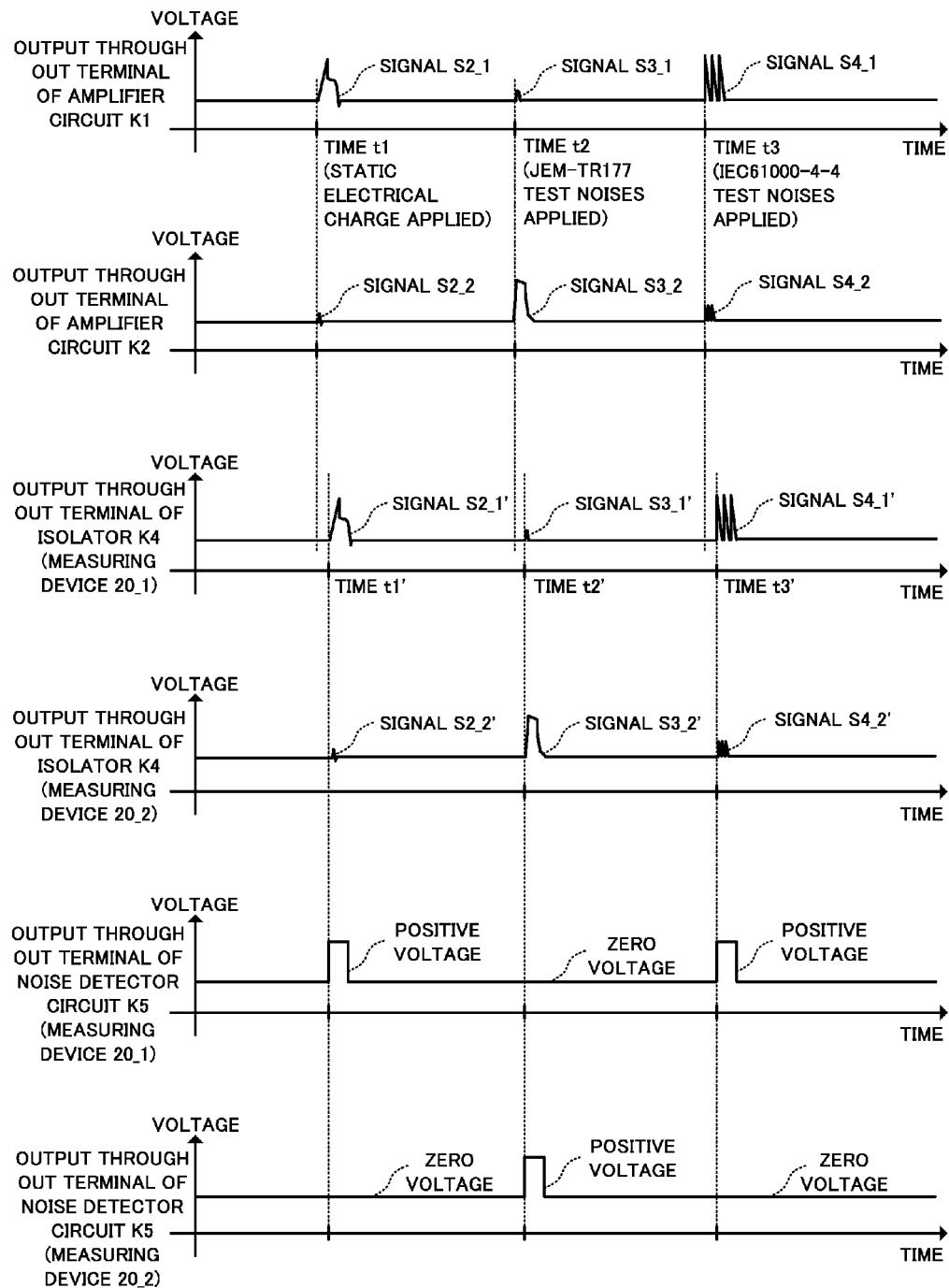
FIG. 3 is a time chart illustrating operations of the noise test system.

As illustrated in FIG. 3, when the signal output through the OUT terminal of the amplifier circuit K1 becomes a waveform indicated by a signal S2_1 (at the time t1), a signal S3_1 (at the time t2) or a signal S4_1 (at the time t3), the signal output through the OUT terminal of the isolator K4 of the test device 20_1 becomes a waveform indicated by a signal S2_1' at a time t1' later than the time t1, becomes a waveform indicated by a signal S3_1' at a time t2' later than the time t2, and becomes a waveform indicated by a signal S4_1' at a time t3' later than the time t3.

In addition, when the signal output through the OUT terminal of the amplifier circuit K2 becomes a waveform indicated by a signal S2_2 (at the time t1), a signal S3_2 (at the time t2) or a signal S4_2 (at the time t3), the signal output through the OUT terminal of the isolator K4 of the test device 20_2 becomes a waveform indicated by a signal S2_2' at a time t1' later than the time t1, becomes a waveform indicated by a signal S3_2' at a time t2' later than the time t2, and becomes a waveform indicated by a signal S4_2' at a time t3' later than the time t3.

Figure 2:
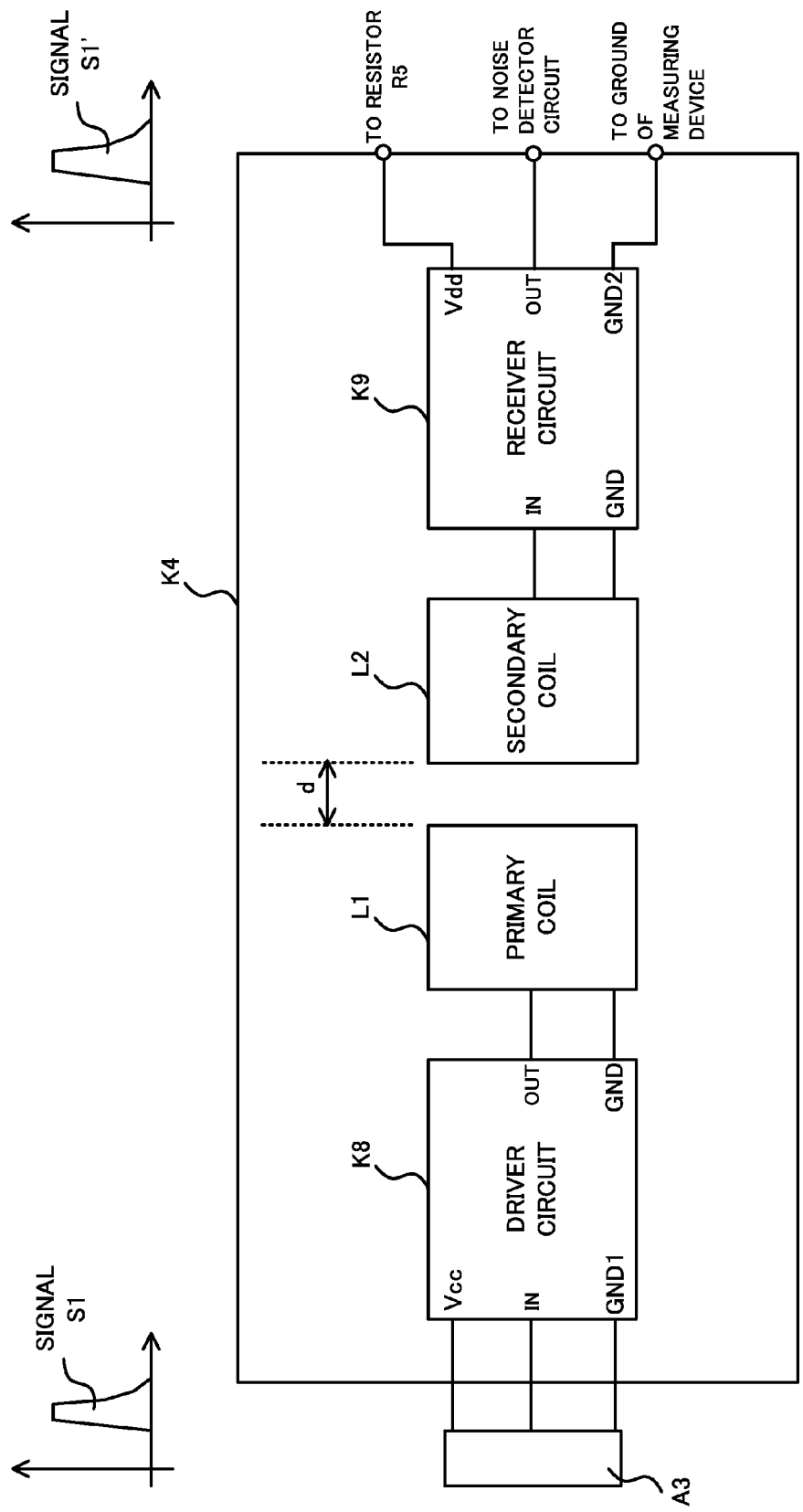
FIG. 2 is a block diagram of an isolator.

In this case, the signal output by the isolator K4 of the test device 20_1 is delayed from the signal output through the OUT terminal of the amplifier circuit K1 is because of a delay of a transmission of the signal from the primary coil L1 to the secondary coil L2 (see FIG. 2), and a time necessary for generating a signal in the receiver circuit K9 (see FIG. 2). The signal output by the isolator K4 of the test device 20_2 is delayed from the signal output through the OUT terminal of the amplifier circuit K2 is because of the similar reason.

When the signal output through the OUT terminal of the isolator K4 of the test device 20_1 becomes a waveform indicated by the signal S2_1', the signal S3_1', or the signal S4_1', the signal output through the OUT terminal of the noise detector circuit K5 of the test device 20_1 becomes a waveform at the times t1' and t3' produced by a positive voltage. In this case, the signal output through the OUT terminal of the noise detector circuit K5 of the test device 20_1 becomes a zero voltage at the time t2' because the voltage of the signal S3_1' is smaller than a voltage (a predetermined voltage) that may cause a false operation of the amplifier circuit K1.

When positive voltages are output twice through the OUT terminal of the noise detector circuit K5 of the test device 20_1, the counter circuit K6 of the test device 20_1 causes the 7-segment LED device K7 of the test device 20_1 to display a number 2.

Accordingly, it becomes understandable that noises of twice among the noises of three times applied to the circuit formed on the test-target board 10 are conducted through the path from the OUT terminal of the amplifier circuit K1 to the ground of the test-target board 10.

In addition, when the signal output through the OUT terminal of the isolator K4 of the test device 20_2 becomes a waveform indicated by the signal S2_2', the signal S3_2', or the signal S4_2', the signal output through the OUT terminal of the noise detector circuit K5 of the test device 20_2 becomes a waveform at the time t2' produced by a positive voltage. In this case, the signal output through the OUT terminal of the noise detector circuit K5 of the test device 20_2 becomes a zero voltage at the times t1' and t3' because the voltage of the signal S2_2' and that of the signal S4_2' are smaller than a voltage (a predetermined voltage) that may cause a false operation of the amplifier circuit K2.

When positive voltage is output once through the OUT terminal of the noise detector circuit K5 of the test device 20_2, the counter circuit K6 of the test device 20_2 causes the 7-segment LED device K7 of the test device 20_2 to display a number 1.

Accordingly, it becomes understandable that the noises of once among the noises of three times applied to the circuit formed on the test-target board 10 are conducted through the path from the OUT terminal of the amplifier circuit K2 to the ground of the test-target board 10.

As explained above, the test device 20_1 of the noise test system 1 of the first embodiment can test as to whether or not noises are conducted through the path from the OUT terminal of the amplifier circuit K1 to the ground of the test-target board 10 (as to whether or not noises are superimposed on the signal output by the amplifier circuit K1) when static electrical charge by electromagnetic waves is applied to the test-target board 10 or when test noises are applied to the ground of the test-target board 10. In addition, the test device 20_1 can count the number of conductions of noises when the noises are conducted through the path.

Likewise, the test device 20_2 can test as to whether or not noises are conducted through the path from the OUT terminal of the amplifier circuit K2 to the ground of the test-target board 10 (as to whether or not noises are superimposed on the signal output by the amplifier circuit K2) when static electrical charge by electromagnetic waves is applied to the test-target board 10 or when test noises are applied to the ground of the test-target board 10. In addition, the test device 20_2 can count the number of conductions of noises when the noises are conducted through the path.

Therefore, the test device 20_1 and the test device 20_2 enables a user to know whether the paths from the respective OUT terminals of the amplifier circuit K1 and the amplifier circuit K2 to the ground of the test-target board 10 are the paths through which noises are likely to be conducted or the paths through which noises are not likely to be conducted. Thus, the user can know whether the noises are likely to be conducted through the path or not likely to be conducted through such a path.

Second Embodiment

Figure 4:
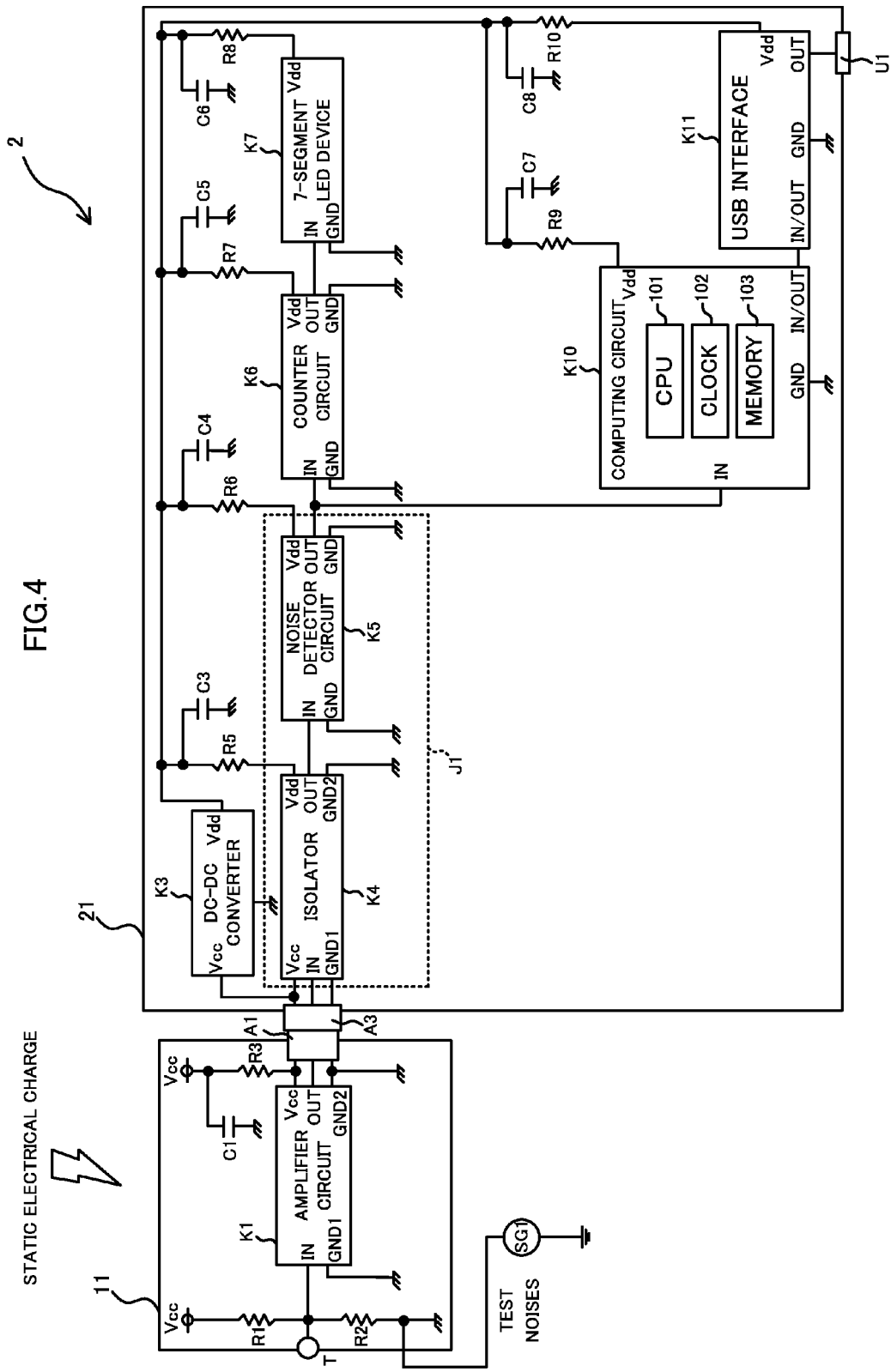
FIG. 4 is a block diagram of a noise test system according to a second embodiment of the present disclosure.

Next, an explanation will be given of a noise test system 2 according to a second embodiment of the present disclosure with reference to FIG. 4. The noise test system 2 employs the configuration of the noise test system 1 of the first embodiment partially modified.

More specifically, the noise test system 2 has the test-target board 10 of the noise test system 1 replaced with a test-target board 11, has the test device 20_1 replaced with a test device 21, and does not utilize the test device 20_2 of the noise test system 1. Accordingly, the same configuration as that of the noise test system 1 in the noise test system 2 will be denoted by the same reference numeral, and the explanation thereof will be omitted.

The noise test system 2 includes the test-target board 11, and the test device 21.

The test-target board 11 utilizes the amplifier circuit K1 utilized for the test-target board 10. Conversely, no amplifier circuit K2 is utilized. The resistors R1 to R3, the capacitor C1, the DC power source Vcc, and the connector A1 disposed around the amplifier circuit K1 all employ the same configuration and the same connection as those of the test-target board 10.

The test device 21 includes the DC-DC converter K3, the isolator K4, the noise detector circuit K5, the counter circuit K6, the 7-segment LED device K7, the resistors R5 to R8, and the capacitors C3 to C6 utilized in the test device 20_1. The configurations and connections of those elements are all the same as those of the test device 20_1.

Moreover, the test device 21 includes a computing circuit K10, a USB (Universal Serial Bus) interface K11, resistors R9, R10, capacitors C7, C8, and a USB terminal U1.

The computing circuit K10 performs various calculations.

The computing circuit K10 has an IN terminal connected to the OUT terminal of the noise detector circuit K5 and the IN terminal of the counter circuit K6, and has a GND terminal connected to the ground of the test device 21.

The computing circuit K10 has an IN/OUT terminal connected to an IN/OUT terminal of the USB interface K11, and has a Vdd terminal connected to the Vdd terminal of the DC-DC converter K3 through the resistor R9. The resistor R9 has one end connected to the Vdd terminal of the DC-DC converter K3 and one end of the capacitor C7, and has the other end connected to the Vdd terminal of the computing circuit K10. The other end of the capacitor C7 is connected to the ground of the test device 21.

The computing circuit K10 utilizes DC power supplied from the Vdd terminal of the DC-DC converter K3, and stores, when a positive voltage is output through the OUT terminal of the noise detector circuit K5, that is, when the positive voltage is applied to the IN terminal, a time at which such a positive voltage is applied as data.

The computing circuit K10 includes a CPU (Central Processing Unit) 101, a clock 102, and a memory 103.

When a positive voltage is output through the OUT terminal of the noise detector circuit K5, that is, when the positive voltage is applied to the IN terminal, the CPU 101 specifies a time at which such a positive voltage is applied from the time counted by the clock 102. Next, the CPU 101 stores the specified time as data in the memory 103.

In addition, when a communication with an external communication device through a USB standard is enabled, and when an instruction is input into the IN/OUT terminal from the external communication device through the USB interface K11, the CPU 101 transmits data stored in the memory 103 and indicating the time, that is, data indicating the time at which the positive voltage is output by the noise detector circuit K5 to the external communication device through the IN/OUT terminal.

The clock 102 includes, for example, an oscillator circuit. The clock 102 counts the time through an oscillation operation by the oscillator circuit.

The memory 103 is, for example, a flash memory, and stores data indicating the time at which the positive voltage is output by the noise detector circuit K5 in accordance with an instruction from the CPU 101.

The USB interface K11 utilizes DC power supplied from the Vdd terminal of the DC-DC converter K3, and performs a communication with the external device in accordance with the USB standard. The USB interface K11 has a Vdd terminal connected to the Vdd terminal of the DC-DC converter K3 through the resistor R10. The resistor R10 has one end connected to the Vdd terminal of the DC-DC converter K3 and one end of the capacitor C8, and has the other end connected to the Vdd terminal of the USB interface K11. The other end of the capacitor C8 is connected to the ground of the test device 21.

The USB interface K11 has the IN/OUT terminal connected to the IN/OUT terminal of the computing circuit K10. Hence, the USB interface K11 transmits an instruction from the external communication device to the computing circuit K10, and obtains data (data indicating a time) output by the computing circuit K10.

In addition, the USB interface K11 has an OUT terminal connected to the USB terminal U1. When obtaining data indicating a time from the computing circuit K10, the USB interface K11 outputs such data through the OUT terminal, thereby outputting the data to the external communication device through the USB terminal U1.

Still further, the USB interface K11 has a GND terminal connected to the ground of the test device 21.

The USB terminal U1 is connected with a USB cable for a communication with the external communication device.

A high-pass filter is formed by a circuit configured by the resistor R9 and the capacitor C7, and, a circuit configured by the resistor R10 and the capacitor C8. This high-pass filter eliminates noises superimposed on DC voltage output through the Vdd terminal of the DC-DC converter K3.

According to the above-explained configuration, when a positive voltage is output by the noise detector circuit K5, the CPU 101 of the computing circuit K10 specifies a time at which the positive voltage is output from a time counted by the clock 102, and stores such a time as data in the memory 103. Next, the CPU 101 outputs, in accordance with an instruction from the external communication device, data stored in the memory 103, that is, data indicating a time at which the positive voltage is output by the noise detector circuit K5 to the external communication device through the USB interface K11.

The external communication device determines, together with a number of conductions, whether either one of static electrical charge or test noises are conducted through the path from the OUT terminal of the amplifier circuit K1 to the ground of the test-target board 10 through, for example, the following scheme. That is, the external communication device searches a time indicated by the data obtained through the USB interface K11 from pieces of data indicating respective times at which static electrical charge and test noises are applied to the test-target board 11 and stored in advance in the external communication device. Through this search, the external communication device determines, together with the number of conductions, whether either one of static electrical charge or test noises are conducted through the path from the OUT terminal of the amplifier circuit K1 to the ground of the test-target board 10.

According to the above-explained noise test system 2 of the second embodiment, it is possible for a user to distinguishably know which one of the static electrical charge or the test noises are likely to be conducted through the path from the OUT terminal of the amplifier circuit K1 to the ground of the test-target board 10 and which one is not likely to be conducted, and to know how much the static electrical charge and the test noises are likely to be conducted through that path based on the number of conductions. Therefore, the user can become to know the above facts.

Third Embodiment

Figure 5:
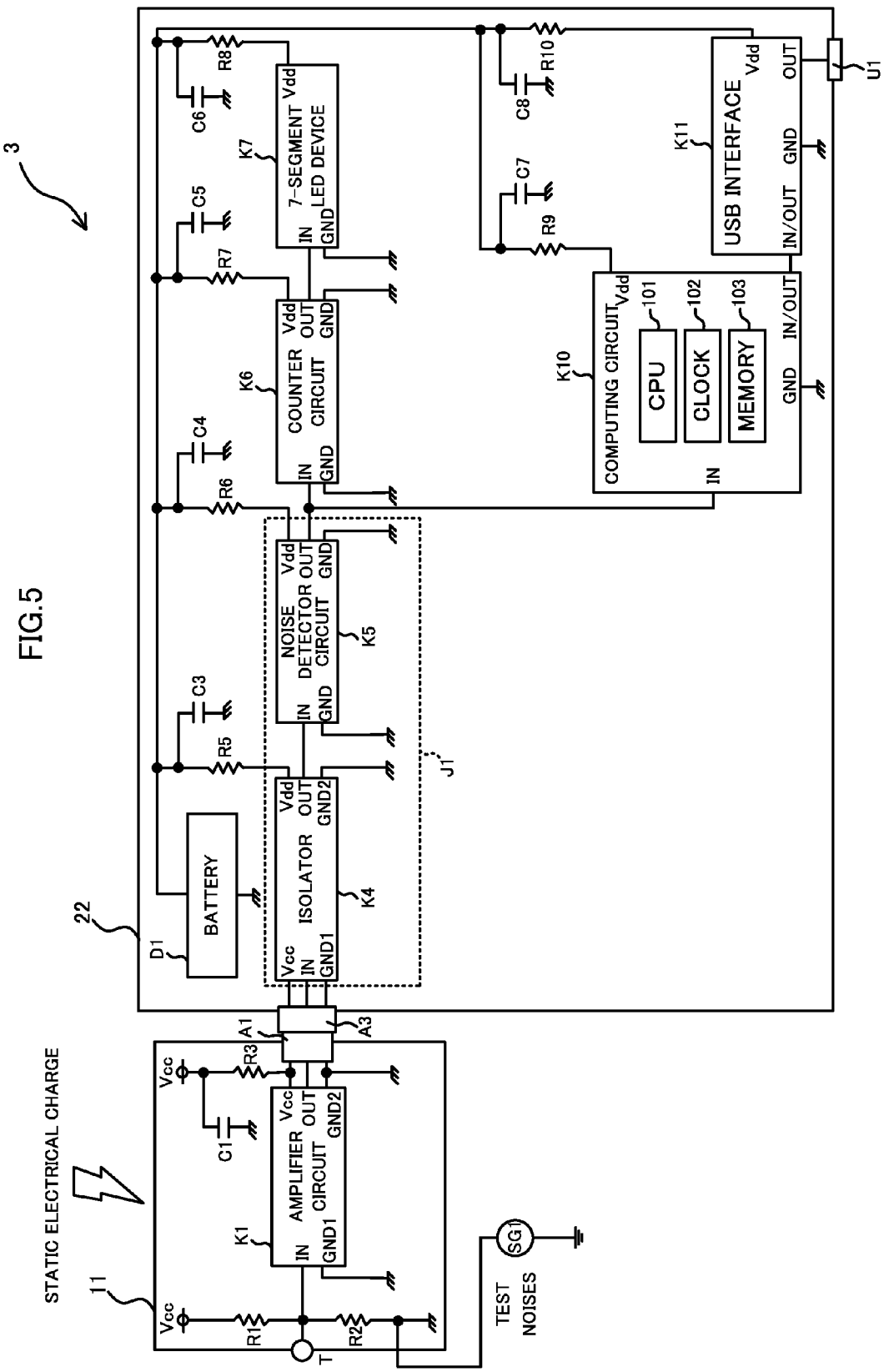
FIG. 5 is a block diagram of a noise test system according to a third embodiment of the present disclosure.

Next, an explanation will be given of a noise test system 3 according to a third embodiment of the present disclosure with reference to FIG. 5. The noise test system 3 employs the configuration of the noise test system 2 of the second embodiment partially modified.

More specifically, the noise test system 3 has the test device 21 of the noise test system 2 replaced with a test device 22. Hence, the same configuration as that of the noise test system 2 in the noise test system 3 will be denoted by the same reference numeral, and the explanation thereof will be omitted.

The noise test system 3 includes the test-target board 11, and the test device 22.

The test-target board 11 employs the same configuration as that of the test-target board of the noise test system 2 according to the second embodiment.

The test device 22 is the test device 21 of the noise test system 2 of the second embodiment partially modified.

More specifically, the test device 22 has the DC-DC converter K3 of the test device 21 replaced with a battery D1. Other configurations of the test device 22 are the same as those of the test device 21.

The battery D1 may be either one of a primary battery or a secondary battery. One terminal of the battery D1 is connected to the respective one ends of the resistors R5 to R10, and the respective one ends of the capacitors C3 to C8, and the other terminal of the battery D1 is connected to the ground of the test device 22.

According to the above-explained configuration, the test device 22 supplies DC power from the battery D1 to the respective Vdd terminals of the isolator K4, the noise detector circuit K5, the counter circuit K6, the 7-segment LED device K7, the computing circuit K10, and the USB interface K11. Hence, when the DC power source Vcc of the test-target board 11 is unable to activate the DC-DC converter K3, that is, when the test devices 20_1, 20_2, and 21 are inoperable, the battery D1 can activate the test device 22, and the test device 22 can perform a test.

The embodiments of the present disclosure were explained above, but the present disclosure is not limited to the aforementioned embodiments, and can be changed and modified in various forms.

For example, according to the noise test system 1 of the aforementioned first embodiment, the test device 20_1 and the test device 20_2 are separate devices from the test-target board 10. Likewise, according to the noise test system 2 of the second embodiment, the test device 21 is a separate device from the test-target board 11, and according to the noise test system 3 of the third embodiment, the test device 22 is a separate device from the test-target board 11. However, the present disclosure is not limited to those configurations.

That is, the test device 20_1 and the test device 20_2 may be integral with the test-target board 10. More specifically, the test device 20_1 and the test device 20_2 may be built in the board of the test-target board 10. Likewise, the test device 21 or the test device 22 may be built in the board of the test-target board 11.

In addition, instead of building all components of the test device 20_1 and the test device 20_2 in the board of the test-target board 10, the tester J1 may be built in a separate board from the test-target board 10, while the counter circuit K6 and the 7-segment LED device K7 may be built in the test-target board 10. This is because that the tester J1 is likely to be affected by a large current generated by noises conducted through the path between the OUT terminal of the amplifier circuit K1 (or the OUT terminal of the amplifier circuit K2) and the ground of the test device 20_1. Likewise, the tester J1 of the test device 21 or the tester J1 of the test device 22 may be built in a separate board from the test-target board 11, while the counter circuit K6, the 7-segment LED device K7, the computing circuit K10, the USB interface K11, and the USB terminal U1 may be built in the test-target board 11.

Moreover, the noise detector circuit K5 of the noise test systems 1 to 3 of the aforementioned respective embodiments includes the low-pass filter and the comparator, outputs a positive voltage and causes the counter circuit K6 to perform counting when the maximum value of the amplitude of the signal input to the comparator (signal output through OUT terminal of isolator K4) is equal to or larger than the preset voltage value, or outputs a zero voltage and does not cause the counter circuit K6 to perform counting when the maximum value is smaller than the preset voltage value. However, the present disclosure is not limited to such a configuration, and the noise detector circuit K5 may have no comparator.

In this case, the noise detector circuit K5 includes the low-pass filter and the amplifier. Next, the noise detector circuit K5 performs filtering on the signal output through the OUT terminal of the isolator K4 by the low-pass filter, amplifies the filtered signal, and outputs the amplified signal. When the amplified signal is equal to or greater than a voltage value that causes the counter circuit K6 to perform counting, the counter circuit K6 increments the display by the 7-segment LED device K7 by one. Conversely, when the amplified signal is smaller than the voltage value that causes the counter circuit K6 to perform counting, the counter circuit K6 keeps the 7-segment LED device K7 displaying as it is.

According to such a configuration, even if the noise detector circuit K5 has no comparator, it is possible to test as to whether or not noises are conducted through the path between the OUT terminal of the amplifier circuit K1 (or OUT terminal of amplifier circuit K2) and the ground of the test device 20_1.

In addition, according to the noise test systems 1 to 3 of the aforementioned respective embodiments, the noise detector circuit K5 and the counter circuit K6 are realized by hardware resources, but the present disclosure is not limited to this case.

That is, the respective functions of the noise detector circuit K5 and the counter circuit K6 may be realized by software resources. In this case, a computing device including a CPU and a memory storing a program to be run by the CPU is built in each of the test device 20_1 and the test device 20_2. Next, when the CPU runs the program and the signal output through the OUT terminal of the isolator K4 is input to the computing device, the CPU compares the maximum value of the amplitude of the input signal (maximum value of voltage) with a preset voltage value. Subsequently, when the maximum value of the voltage of the input signal is equal to or larger than the preset voltage value, the CPU increments a display by the 7-segment LED device K7 by one. Conversely, when the maximum value of the voltage of the input signal is smaller than the preset voltage value, the CPU keeps the 7-segment LED device K7 displaying as it is. According to this configuration, the respective functions of the noise detector circuit K5 and the counter circuit K6 can be realized by software resources. Hence, the noise detector circuit K5 and the counter circuit K6 can be eliminated from the test device 20_1 and the test device 20_2.

According to the noise test system 1 to 3 of the aforementioned respective embodiments, the test noises in accordance with the domestic standard JEM-TR177 and the test noises in accordance with the international standard IEC61000-4-4 are applied to the ground terminal of the resistor R2 (ground of circuit formed on the test-target board 10) disposed on the test-target board 10, but the present disclosure is not limited to this case.

That is, the above-explained test noises may be applied to, for example, the terminal of the resistor R2 at the input-terminal-T side (signal line of circuit formed on test-target board 10) and disposed on the test-target board 10.

Still further, according to the noise test system 1 of the aforementioned first embodiment, the test device 20_1 is connected to the OUT terminal that is the output terminal of the amplifier circuit K1 to allow a user to know whether or not the path from the OUT terminal of the amplifier circuit K1 to the ground of the test-target board 10 is a path through which noises are likely to be conducted. In addition, the test device 20_2 is connected to the OUT terminal that is the output terminal of the amplifier circuit K2 to allow the user to know whether or not the path from the OUT terminal of the amplifier circuit K2 to the ground of the test-target board 10 is a path through which noises are likely to be conducted.

The present disclosure is, however, not limited to this case. That is, the test device 20_1 and the test device 20_2 can be connected to, not only the OUT terminals of the amplifier circuits K1, K2 but also a desired path on the circuit formed on the test-target board 10. When the test device 20_1 and the test device 20_2 are connected to a desired path on the circuit, it becomes possible for such test devices to allow the user to know whether or not the desired path is a path through which noises are likely to be conducted.

In addition, according to the noise test system 3 of the aforementioned third embodiment, the test device 22 uses the battery D1 to supply DC power to the Vdd terminals of the isolator K4, the noise detector circuit K5, the counter circuit K6, the 7-segment LED device K7, the computing circuit K10, and the USB interface K11, but the present disclosure is not limited to this configuration.

That is, instead of the battery D1, the test device 22 may be provided with a DC power connector. In the case of this configuration, DC power from a DC power source supplied through the DC power connector can be supplied to the respective Vdd terminals of the isolator K4, the noise detector circuit K5, the counter circuit K6, the 7-segment LED device K7, the computing circuit K10, and the USB interface K11.

In the aforementioned embodiments, the program run by the test devices 21, 22 may be distributed in a manner stored in a computer-readable recording medium, such as a flexible disk, a CD-ROM (Compact Disc Read-Only Memory), a DVD (Digital Versatile Disc), or an MO (Magneto-Optical Disc), and such a program may be installed in a computer or the like to configure a device that performs the similar control to that of the test devices 21, 22.

The aforementioned program may be stored in a disk device or the like of a predetermined server device over a communication network like the Internet, and may be, for example, downloaded in a manner superimposed on carrier waves.

When, for example, the above-explained program run by the test devices 21, 22 is realized by each cooperative OS (Operating System) or is realized by cooperative OS and application, portions other than the OS may be distributed in a manner stored in media, or may be downloaded.

The present disclosure permits various embodiments and modifications without departing from the broadest scope and spirit of the present disclosure. The aforementioned embodiments are to explain the present disclosure, and are not to limit the scope and spirit of the present disclosure. That is, the scope and spirit of the present disclosure should be defined by the appended claims rather than the aforementioned embodiments. Various modifications that can be carried out within the scope of the claims and the equivalent range thereto should be within the scope and spirit of the present disclosure.

INDUSTRIAL APPLICABILITY

The present disclosure is suitable to find a path through which noises are likely to be conducted and a path through which noises are not likely to be conducted.

REFERENCE SIGNS LIST 1, 2, 3 Noise test system
10, 11 Test-target board
20, 21, 22 Test device
A1, A2, A3 Connector
K1, K2 Amplifier circuit
K3 DC-DC converter
K4 Isolator
K5 Noise detector circuit
K6 Counter circuit
K7 7-segment LED device
K8 Driver circuit
K9 Receiver circuit
K10 Computing circuit
K11 USB interface
L1 Primary coil
L2 Secondary coil
SG1 Signal source
U1 USB terminal

The invention claimed is:

1. A test device comprising:
   an isolator which receives, through electromagnetic induction, noises applied to a test-target circuit and conducting through a path on the circuit, and which is provided on a separate board from a board on which the test-target circuit is formed; and
   a noise detector which detects a conduction of the noises through the path when the isolator receives the noises, and which is provided on the separate board.

2. The test device according to claim 1, wherein:
   the separate board comprises a connector to be connected with the board on which the test-target circuit is formed; and
   the isolator becomes able to receive the noises through electromagnetic induction when the board on which the test-target circuit is formed is connected with the separate board through the connector.

3. The test device according to claim 1, further comprising:
   a counter that counts a number of conductions of the noises through the path detected by the noise detector; and
   a display that displays the number of conductions of the noises counted by the counter.

4. The test device according to claim 3, wherein the counter and the display are provided on a board which is separate from the board formed with the circuit and which is the board provided with the isolator and the noise detector.

5. The test device according to claim 1, wherein the noise detector detects a conduction of the noises through the path when the isolator receives the noises and a maximum value of an amplitude of the received noises is equal to or larger than a preset value.

6. The test device according to claim 1, further comprising:
   a clock that counts a time; and
   a memory that stores a time counted by the clock when the noise detector detects a conduction of the noises through the path.

7. A test method by a test device, the method comprising:
   a receiving step in which the test device causes an isolator to receive, through electromagnetic induction, noises applied to a test-target circuit and conducting through a path on the circuit, the isolator being provided on a separate board from a board on which the test-target circuit is formed; and
   a detecting step in which the test device causes a noise detector to detect a conduction of the noises through the path when the isolator receives the noises, the noise detector being provided on the separate board.

8. A non-transitory computer-readable recording medium storing a program that causes a computer controlling a test device to realize:
   a receiving function of causing an isolator to receive, through electromagnetic induction, noises applied to a test-target circuit and conducting through a path on the circuit, the isolator being provided on a separate board from a board on which the test-target circuit is formed; and
   a detecting function of causing a noise detector to detect a conduction of the noises through the path when the isolator receives the noises, the noise detector being provided on the separate board.

\* \* \* \* \*